United States Patent [19]

Nazarenko

[11] 4,371,459

[45] Feb. 1, 1983

[54] FLEXIBLE SCREEN-PRINTABLE CONDUCTOR COMPOSITION

[75] Inventor: Nicholas Nazarenko, West Chester, Pa.

[73] Assignee: E. I. Du Pont de Nemours and Company, Wilmington, Del.

[21] Appl. No.: 331,893

[22] Filed: Dec. 17, 1981

[51] Int. Cl.³ .............................................. H01B 1/02
[52] U.S. Cl. .................................... 252/514; 106/1.14;
  106/1.19; 252/511; 252/512; 252/513;
  427/393.5; 428/901; 29/622
[58] Field of Search .............. 252/514, 512, 513, 511,
  252/518; 106/1.14, 1.19, 290, 308 M, 311;
  200/265, 292; 428/901, 457, 458, 412, 421, 480,
  482; 427/88, 96, 282, 102, 123, 125, 393.5, 372
  R; 29/622, 624, 625, 630 R

[56] References Cited

U.S. PATENT DOCUMENTS

| | | | |
|---|---|---|---|
| 3,414,417 | 12/1968 | Miller et al. | 106/26 |
| 3,719,610 | 3/1973 | Prentice | 252/513 |
| 3,957,694 | 5/1976 | Bolon et al. | 252/514 |
| 3,968,056 | 7/1976 | Bolon et al. | 252/514 |
| 3,992,212 | 11/1976 | Youtsey et al. | 106/1 |
| 4,032,350 | 6/1977 | Greenstein | 252/514 |
| 4,039,721 | 8/1977 | Weitze et al. | 252/514 |
| 4,054,714 | 10/1977 | Mastrangelo | 252/514 |
| 4,098,945 | 7/1978 | Oehmke | 252/514 |
| 4,219,448 | 8/1980 | Ross | 252/500 |
| 4,234,304 | 11/1980 | Heytmeijer | 252/514 |

*Primary Examiner*—J. L. Barr

[57] ABSTRACT

Screen-printable conductor composition comprising (a) a conductive phase containing silver and base metal powders dispersed in a solution of (b) a multipolymer prepared by copolymerization of vinyl acetate, vinyl chloride, and an ethylenically unsaturated dicarboxylic acid and a linear aromatic polyester resin dissolved in (c) volatile nonhydrocarbon solvent.

16 Claims, No Drawings

FLEXIBLE SCREEN-PRINTABLE CONDUCTOR COMPOSITION

FIELD OF THE INVENTION

This invention relates to a flexible, screen-printable conductive composition and, in particular, to a conductive composition useful for fabricating membrane touch switches.

BACKGROUND OF THE INVENTION

A membrane touch switch is a momentary contact, low voltage switch which includes a first and a second switching element or membrane, disposed on opposite sides of an insulating membrane. The insulative membrane has appropriate apertures through which electrical contact between the switching elements may be made. Each switching element has a layer of conducting material formed in a predetermined circuit pattern on one surface thereof. One of the switching elements is connected to a source of electrical potential and the other to ground potential. An electrical circuit is completed when one of the switching elements is depressed and thus extended through the aperture in the insulating membrane to bring the conducting material disposed on the surface of that switching element into contact with the conducting material on the other switching element.

Typically, each of the switching elements includes a substrate of a flexible material, for example, a polyester film such as that sold by E. I. du Pont de Nemours and Company, Inc. under the trademark Mylar®. Of course, other flexible materials, such as polycarbonate film or polyvinyl fluoride (PVF) film may be used as the flexible substrate. In some instances, the substrate of the upper switching elements is flexible, with the substrate of the base switching element being rigid.

The circuit pattern is usually formed on the switching element by applying onto the substrate a thick film paste composition containing particles of a conductive material dispersed in a volatile organic solvent-resin medium. After screen printing the composition is dried, ordinarily by heating, and the volatile organic material in the solvent-resin medium is driven off. The resin is left to bind together the conductive particles, thus forming the electrically conducting circuit pattern on the switching element.

Membrane touch switches are fabricated using either a semiautomatic or an automatic high speed (e.g., reel-to-reel) technique. In the semiautomatic processing technique, the substrate is manually fed to a printing apparatus and the composition is screen printed onto the surface of the substrate. In the automatic high speed reel-to-reel technique, a roll of substrate material is passed through an automatic printing station and through a drying station before being taken up on suitable take-up reels. The composition is automatically screen printed and dried.

The technology surrounding membrane touch switches in general, and the compositions therefor in particular, are continuously changing to satisfy more stringent environmental requirements, to provide lower operating costs, and to meet changing design criteria and increasing functional requirements imposed on them by the marketplace. Increased demands on paste composition functionality include more durability to harsh environmental changes, increased ability to use the switch at higher temperatures and increased abrasion resistance and increased resistance to high pressure electrical connectors. The most immediate market needs are perceived at this time to be lower processing costs and increased product capabilities. Processing costs can be reduced by providing paste compositions with better conductivity efficiency (i.e., greater conductivity per unit weight of conductive material), less and/or lower cost conductive material and higher throughput capability including longer screen life.

Heretofore, the conductive materials for membrane touch switches have been noble metals, especially silver. However, upward fluctuations in the price of silver metal have made it extremely important to find ways to substitute less expensive conductive materials, such as base metals, without adversely affecting either the primary electrical properties or the secondary functional properties mentioned above.

SUMMARY OF THE INVENTION

The invention is directed primarily to a screen printable conductor composition which is useful for making membrane touch switches which comprises 70-90% by weight, basis total solids, of (a) a conductive phase containing finely divided particles of silver and a base metal selected from the group consisting of aluminum, tin and nickel and mixtures thereof dispersed in a solution of (b) 30-10% by weight of a multipolymer prepared by copolymerization of vinyl acetate, vinyl chloride and ethylenically unsaturated dicarboxylic acid and a linear aromatic polyester resin dissolved in (c) volatile nonhydrocarbon polar solvent.

In a second aspect, the invention relates to a method of making a membrane switching element comprising the steps of applying onto a flexible substrate by screen printing a composition as described above and heating the printed composition to remove the solvent therefrom and to effect crosslinking among the functional groups of the multipolymer system. In a still further aspect the invention relates to the membrane switching element formed as the product of the method.

DETAILED DESCRIPTION OF THE INVENTION

A. Conductive Phase

The silver component of the conductive phase constitutes 55-95% by weight and preferably 60-90% by weight of the conductive phase. The silver particles used herein can be of either flake or nonflake morphology. The nonflake powders can be irregularly shaped or spherical. However, flake silver powders are preferred due to their greater contribution to conductivity and dispersibility. By flake morphology is meant a silver powder whose predominant shape is flake as determined by scanning electron microscopy. Such flake silver powders typically have a surface area of approximately 1 m$^2$/g and over 99% purity.

The base metal component of the conductive phase must primarily exhibit stable conductivity under a wide variety of environmental conditions and the finely divided powders thereof should be capable of forming relatively stable dispersions in the liquid medium. Aluminum, nickel and tin have been found to be particularly suitable in this regard.

The base metal component of the conductive phase constitutes 50-5% and preferably 40-10% by weight of the conductive phase.

The particle size of the conductive phase components is not narrowly critical from the standpoint of their technical effectiveness in the invention. However, they should, of course, be of a size appropriate to the manner in which they are applied, which is usually screen printing. Thus the conductive phase materials should be no bigger than 15 m and preferably should be below about 10 μm. As a practical matter, an available particle size of the silver and the base metals 0.1 to 10 μm.

B. Polymeric Components.

1. In General

The polymeric components comprise 10-30% and preferably 15-20% by weight of the total solids contained in the invention composition. Within these limits of total polymer content, it has been found that the ratio of linear aromatic polyester to acidic multipolymer should be within the range of 0.5-10, a ratio of 0.8-2 being preferred. A polyester-to-acidic polymer ratio of 1-1.5 is especially preferred. Outside these ratio limits it has been found that higher amounts of polyester degrade flexibility and lower amounts of polyester tend to yield metallizations having too low abrasion resistance.

Both of the polymer components must be completely dissolved in the organic solvent when the composition is applied to a substrate.

2. Polyester

The polyester resins which are used in the invention are polycondensation products of an aromatic dicarboxylic acid such as isophthalic or terephthalic acid with a $C_{2-4}$ dihydroxy alkane such as ethylene or propylene glycol. Poly(ethylene isophthalate) is preferred.

It is also preferred that the polyester component have an intrinsic viscosity (I.V.) measured in a 60/40 by weight phenol/1,1,2,2-tetrachloroethane solution at 30° C. of from 0.5 to 1.0, 0.6 to 0.85 being preferred. Above about 1.0 I.V. the solubility characteristics of the resin are poorer and below about 0.5 I.V. the resin lacks sufficient strength to function adequately as a binder for the system.

Typically, the polyester resin used in the organic medium of the instant invention exhibits the following properties: specific gravity, in the range from about 1.2 to about 1.35; viscosity in carbitol acetate (15-30 weight %), in the range from about 1 to about 5 Pascal seconds at 22° C.; Tg, °C., in the range from about 25 to about 76; carboxyl number, eq/$10^6$ gm., in the range from about 35 to about 60; color, Gardner b, in the range from about 15 to about 30; softening point (R and B) °C., in the range from about 130 to about 165; tensile strength, psi, in the range from about 800 to about 8500; and solubility, up to 40% solids dissolvable in MEK at about 25° C. A preferred linear thermoplastic polyester resin is that sold by Goodyear Tire and Rubber Company, Akron, Ohio as Vitel® linear thermoplastic polyester resin, grade number PE-200. A preferred linear thermoplastic polyester resin has the following physical properties: specific gravity, 1.25; viscosity in carbitol acetate (15-30 weight %), 1 to 5 Pascal seconds at 22° C.; Tg, °C., 67±5; carboxyl number, eq/$10^6$ gm., 50 max; Color, Gardner b, 30 max; moisture, %, 0.3 max; particle size, approximately ⅛" cubes, 100% through ¼" screen; solubility, 25% solids completely soluble in MEK at about 25° C.; softening point (R and B) °C., 155±8; and tensile strength, psi, 7800. The resin is dissolved in the solvent to form the organic medium.

3. Multipolymer

Suitable multipolymers are those derived by copolymerization of vinyl acetate, vinyl chloride and ethylenically unsaturated dicarboxylic acids. Thus, these polymers are random copolymers in which the various monomeric units are randomly distributed along the polymer chain. Though many polymerizable ethylenically unsaturated dicarboxylic acids can be used in the multipolymer, as a practical matter, itaconic acid, fumaric acid, maleic acid and maleic anhydride will be most used because of their more favorable polymerization rates and commercial availability.

It has been found that the amount of acid monomer units in the multipolymer chain should be from 0.3-10% by weight of the polymer and preferably from 0.5-3%. At these values the best flexibility and abrasion resistance are obtained. A range of 2-2-½% is particularly preferred.

In addition, it is preferred that the weight ratio of the vinyl chloride and vinyl acetate monomers be from 3-8. It will be recognized that minor amounts of additional ethylenically unsaturated monomers such as monocarboxylic acids, and the like can also be included in the multipolymer. However, they should not constitute more than about 10% by weight of the polymeric units of the polymer chain.

As used herein the term "multipolymer" includes terpolymers as well as higher multipolymers. C. Solvent Component The solvent component of the invention is a nonhydrocarbon polar solvent which must be capable of completely dissolving both the polyester and the multipolymer components of the polymer phase. In addition, the solvent must be sufficiently volatile that it can be vaporized from the composition below the thermal degradation temperature of the flexible substrate. Such materials include esters, alcohols and ethers as well as halogenated aromatics. Though halogenated aromatics such dichlorobenzene are fully operable in the invention, they are not preferred because of the health hazards which may be associated with them. Preferred solvents therefore include materials such as ethylene glycol phenyl ether, benzyl alcohol, glycol ether acetates, and carbitol acetate. Carbitol acetate is especially preferred. Mixtures of various solvents will frequently be used in order to adjust the volatility of the solvent component of the organic medium.

In general, the boiling point of the solvent component(s) should be no less than about 150° C. A boiling point range of from 150° to 220° C. is preferred. Solvents having a boiling point below about 150° C. tend to thicken the composition excessively during screening as solvent is evaporated therefrom. This can, of course, result in plugging of the screens which are used for printing patterns of the material onto the substrate. Within this limitation, however, the volatility of the solvent will be selected in consideration of the method of solvent removal and/or fabrication. For example, when the high speed reel-to-reel procedure is used it is essential that the solvent be removed quite rapidly during processing. Thus lower boiling solvents must be used such as those boiling from 150° to 175° C. On the other hand, when slower fabrication procedures are used, less volatile solvents may be used such as those boiling from 175° to 220° C. In either case the solvent removal is ordinarily accelerated by mildly heating the printed substrate. Typically, the substrate is heated in a hot air oven to 70° to 90° when using more volatile solvents in the reel-to-reel process and 90° to 120° C. when using less volatile solvents in the semiautomatic processes.

Ordinarily the solvent is the sole liquid component of the invention composition in which the polymer components must be essentially completely soluble. However, the solvent system can contain minor amounts of other additives so long as they do not change the essence of the solvent medium. Of particular interest in this regard is the use of small amounts of wetting agents which serve as antisettling agents for the dispersed particles of the conductive phase. Relatively long chain trialkyl acid phosphates, such as tridecyl acid phosphate, have been found to be beneficial at a concentration of about 1% by weight of the entire composition. While the use of such materials are desirable in that they facilitate preparation of the dispersion and increase its stability, they are not deemed to be essential from the standpoint of operability.

D. Storage

It has been found that some of the properties of the composition of the invention tend to change upon prolonged storage at ordinary ambient storage conditions such as 20°-40° C. For example, after about one week of storage at 20° C., a drop in viscosity can be observed and concomitantly conductivity and flexibility of the printed compositions have also been observed to be reduced. For those instances where these properties may be critical, it has been found that degradation upon storage can be reduced to an insignificant level by storage at a temperature of about 10° C. (50° F.) or below. The invention composition should not, however, be stored below the freezing point of the polymer solution.

E. Substrate

Suitable substrates on which the compositions of the invention can be printed for use in membrane switches will ordinarily be organic polymer films having the properties of high flexibility, tensile strength, elasticity, dimensional stability and chemical inertness. Transparency is also a frequently desired property for such materials. Materials meeting these criteria include polyolefins such as polyethylene and polypropylene, polyesters, and polyvinyl halides such as polyvinyl chloride and polyvinyl fluoride. The most highly preferred and most widely used substrate material for membrane switches is polyester film, e.g., Mylar ® polyester film.

E. Test Procedures

1. Viscosity

Viscosity is measured at about 25° C. on a Brookfield RVT viscometer at 5 rpm using a No. 5 spindle.

2. Preparation of Switching Element

The paste composition was printed on a 5 mil electrical grade Mylar ® polyester film through a 280 mesh, stainless steel 1.0 mil epoxy emulsion screen. The printed parts were dried in a laboratory air circulating oven at 120° for ten minutes to form a switching element. The resultant printed and dried switching element was tested for resistivity, both before and after creasing, adhesion (using cellophane tape sold as Scotch brand, #810), scratch resistance and abrasion resistance.

3. Resistivity

Resistivity was measured using a Hewlett Packard 3466A digital voltmeter at K function and V auto range using single point probes. The switching element was measured for resistivity, then folded in against itself and out against itself so as to create a crease perpendicular to a conductor line. (A crease in and a crease out define one full crease.) Resistivity was then remeasured.

4. Adhesion

Adhesion was measured with the switching element on a hard flat surface, and a two inch length of Scotch brand, #810 tape placed over approximately one inch of the printed conductor pattern. Smoothing pressure was applied with the fingers to insure good bonding of the tape adhesive to the switching element, then peeled back in an upward motion and checked for evidence of conductor transfer.

5. Scratch Test

The fingernail scratch test was performed with the switching element on a hard, flat surface. The element was scratched several times with the fingernail at moderate pressure perpendicular to the printed conductor pattern and checked for evidence of conductor removal.

6. Abrasion Resistance

Abrasion resistance was measured by the pencil hardness test according to the procedure described in ASTM D-3363-74.

The invention will be more clearly understood by reference to the Examples which follow:

EXAMPLES

EXAMPLE 1

A mixture of 30 g of Bakelite[1] VMCA resin and 70 g butyl Cellosolve[2] acetate were stirred at 80° C. until the resin completely dissolved (about 3 hr). The solution was allowed to cool slowly to ambient temperature. A 50% weight aluminum paste was then prepared from 50 g of the above polymer solution and 50 g of Cotronics Corporation ultra fine aluminum (mean dia. 8 $\mu$m) by mixing the components on a three roll mill.

1 Bakelite ® is a registered trademark of Union Carbide Corporation, New York, NY and VMCA is their tradename for copolymers of maleic acid with vinyl chloride and vinyl acetate.
2 Cellosolve is a registered tradename of Union Carbide Corporation, New York, NY for mono- and dialkyl ethers of ethylene glycol and derivatives thereof.

A 40% weight silver composition was prepared by mixing 3.6 g of the above-described aluminum paste and 6.4 g of Du Pont 5007 silver conductor. The resultant product was allowed to stand overnight at room temperature.

Samples of the 50% aluminum paste and the 18/40 Al/Ag paste blend were printed through a 280 mesh stainless steel 1 mil epoxy emulsion screen onto a 5 mil polyester Mylar ® film and the printed parts were dried in a laboratory circulating oven at 120° C. for ten minutes and tested for standard properties. The results of these tests are given in Table I below.

TABLE I

Properties of Printed Aluminum-Containing

| Conductive Phase | Resistivity (mΩsq/mil) Initial | Resistivity (mΩsq/mil) Creased | Scotch Tape Adhesion | Scratch Test | Pencil Hardness |
|---|---|---|---|---|---|
| Al | Open | — | Very good | Very good | 2H |
| 18/40 Al/Ag | 70 | 95 | Very good | Very good | 4H |

When the above-procedure was repeated using carbitol acetate as the solvent, the same secondary properties were obtained. Initial resistivity was 51 and resistivity after crease was 100, which is very comparable.

EXAMPLE 2

Two pastes were prepared in the manner of Example 1 from 100 g of aluminum powder and 98 g of 30/70 mixture of VMCA resin and butyl Cellosolve ® acetate. To one of the samples were added and thoroughly dispersed 2 g of tridecyl acid phosphate. The paste containing none of the acid phosphate had a viscosity over 100 Pa.S and the aluminum particles began to settle out after 24 hours. On the other hand, the phosphate-containing sample had a viscosity of only 58.4 Pa.S and essentially no settling could be observed after a full week had passed.

EXAMPLE 3

A series of aluminum-containing pastes was prepared by the procedures of Example 1 in which various amounts of silver were added. Each of these samples was screen-printed, dried at 120° C. for 10 minutes and tested with respect to resistance, adhesion, scratch resistance and hardness. The results are given in Table II below.

TABLE II

Effect of Silver Content on Physical Properties of Printed Conductor Pastes

| Silver Content % wt | Aluminum Content % wt | Resistance (mΩ/sq/mil) Initial | Resistance (mΩ/sq/mil) Creased | Scotch Tape Adhesion | Scratch Test | Pencil Hardness |
|---|---|---|---|---|---|---|
| 30 | 26 | 260 | 3810 | Very good | Very good | 2H |
| 35 | 22 | 98 | 185 | Very good | Very good | 2H |
| 40 | 18 | 63 | 90 | Very good | Very good | 4H |
| 47 | 12.5 | 30 | 40 | Very good | Very good | 4H |
| 62.5 | — | 12 | 30 | Very good | Very good | 4H |

The foregoing data show an expected reduction in resistance with increased silver content and also an increase in hardness. However, the resistance after creasing, which is a critical property for flexible circuitry, is little changed from the initial resistance in those compositions containing from about 60% weight to above 90% weight silver.

EXAMPLE 4

An aluminum dispersion was prepared by the procedures of Example 1 containing 100 g of aluminum powder, 98 g of 30% weight VMCA resin in butyl Cellosolve ® acetate and 2 g of tridecyl acid phosphate. In addition, a 40% weight silver ink was prepared by mixing 48 g of the foregoing aluminum dispersion with 84 g of Du Pont 5007 silver paste. The mixture was allowed to stand overnight and the viscosity was measured at 24° C.

The above described 40% weight silver ink was then divided into two equal portions one of which was stored at room temperature (about 20° C.) and the other in a refrigerator at 7° C. Representative samples of each of the pastes were taken at various intervals and their viscosity measured. The samples were then used to prepare a screen printed pattern on Mylar ® polyester film and the properties tested. The results of these tests are given in Table III below:

TABLE III

Effect of Reduced Storage Temperature

| Aging time (Days) | Aging Temperature (°C.) | Viscosity Pa.s | Resistance (mΩ/sq/mil) Initial | Resistance (mΩ/sq/mil) Creased | Scotch Tape Adhesion | Scratch Test | Pencil Hardness |
|---|---|---|---|---|---|---|---|
| 1 | 20 | 58.4 | 63 | 75 | V.good | V.good | 3H |
| 8 | 7 | 52.0 | 70 | 96 | V.good | V.good | 3H |
|  | 20 | 40.8 | 60 | 89 | V.good | V.good | 3H |
| 15 | 7 | 55.2 | 65 | 85 | V.good | V.good | 3H |
|  | 20 | 25.6 | 85 | 117 | V.good | V.good | 3H |
| 21 | 7 | 53.2 | 67 | 80 | V.good | V.good | 3H |
|  | 20 | 10.0 | 325 | 345 | V.good | V.good | 3H |
| 28 | 7 | 60.2 | 66 | 91 | V.good | V.good | 3H |
|  | 20 | 12.2 | 270 | 300 | V.good | V.good | 3H |
| 35 | 7 | 52.8 | 65 | 89 | V.good | V.good | 3H |
|  | 20 | 10.1 | 450 | 460 | V.good | V.good | 1H |

The above data show that by storing the composition of the invention at 7° C., any change in viscosity is kept at an insignificant level. On the other hand, the storage at room temperature permitted a viscosity decrease to a level of 16% of the original. Even more dramatic, however, is the fact that the materials stored at room temperature incurred substantially higher resistivity values after three weeks storage.

EXAMPLE 5

A series of four compositions was prepared in the manner of Example 1 except that different Bakelite ® vinyl chloride-vinyl acetate polymer resins were used. The data in Table IV below show that inclusion of random acidic chain substituents in the vinyl chloride-vinyl acetate copolymer chain results in considerably better resistivity after creasing and also better hardness.

TABLE IV

Effect of Functional Substitution in the Vinyl Chloride-Vinyl Acetate Polymer

| Resin Designation | Functional Side Groups | Resistance (mΩ/sq/mil) Initial | Creased | Scotch Tape Test | Scratch Test | Pencil Hardness |
|---|---|---|---|---|---|---|
| VYLF | None | 54 | 1710 | V.good | V.good | HB |
| VROH | 1.8–2.2% wt. hydroxyl groups | 44 | 180 | V.good | V.good | HB |
| VMCA | 2.1–2.5% wt. maleic acid | 52 | 98 | V.good | V.good | 2H |
| VMCC | 0.8–1.1% wt. maleic acid | 56 | 92 | V.good | V.good | 2H |

EXAMPLE 6

A series of three aluminum-silver pastes was prepared in the same manner as Example 1 except that aluminum powders of different mean particle size were used. The data show that a mean particle size above about 15 μm results in poor printability and that very large particle sizes, on the order of 35 μm or above, may also result in lower hardness.

TABLE V

Effect of Base Metal Particle Size

| Mean Particle Diameter of Al (μm) | Al/Ag Paste Printability | Resistance (mΩ/sq/mil) Initial | Creased | Scotch Tape Test | Scratch Test | Pencil Hardness |
|---|---|---|---|---|---|---|
| 8[1] | Very good | 62 | 80 | V.good | V.good | 4H |
| 20[2] | Fair | 600 | Open | V.good | V.good | 5H |
| 38[3] | Poor | 31 | 35 | V.good | V.good | 1H |

[1]Cotronics Corp., New York, NY
[2]Alcan Metal Powders, Elizabeth, NJ
[3]Apache Chemicals Inc., Seward, IL

EXAMPLE 7

In this example a series of silver pastes was prepared in which finely divided particles of aluminum and several other materials were used as the base material. Each of the pastes contained about 50% weight conductive phase and was prepared by mixing 2.4 g of the base material with 4.2 g of Du Pont 5007 silver conductor paste. Duplicate samples of each of the pastes were then printed onto Mylar ® polyester film and dried at 120° C. for 10 minutes. One of each sample was tested immediately and the other was subjected to a humidity test (Military Standard 202E, Test method 101D) at 40° C. and 95% relative humidity. Both initial (I) test properties and post-humidity (AH) test properties were measured and recorded, the results of which are given in Table VI below.

TABLE VI

Use of Various Base Materials

| Base Material | Sequence | Resistance (mΩ/sq/mil) Initial | Creased | Scotch Tape Test | Scratch Test | Pencil Hardness |
|---|---|---|---|---|---|---|
| Al | I | 63 | 90 | V.good | V.good | 4H |
|    | AH | 53 | 94 | V.good | V.good | 4H |
| Ni | I | 43 | 63 | V.good | V.good | 3H |
|    | AH | 41 | 60 | V.good | V.good | 2H |
| Sn | I | 32 | 40 | V.good | V.good | 3H |
|    | AH | 29 | 45 | V.good | V.good | 2H |
| Graphite | I | 104 | 270 | V.good | V.good | 4H |
|    | AH | 94 | 810 | V.good | V.good | 2H |
| Cu | I | 35 | 230 | V.good | V.good | 3H |
|    | AH | 32 | Open | V.good | V.good | B |
| Ag-coated glass | I | 51 | 66 | V.good | V.good | 4H |
|    | AH | 47 | Open | V.good | V.good | 2H |
| Mica | I | 144 | 360 | V.good | V.good | 4H |
|    | AH | 98 | Open | V.good | V.good | 2H |

The above data show that the base metals aluminum, nickel and tin each gave good after-crease resistance even after being exposed to highly humid conditions. However, copper exhibited poor after-crease resistance even before the humidity test. In addition, copper yielded printed thick films of excessive softness. Silver-coated glass yielded films having satisfactory initial resistivity, but failed the after-crease resistivity test. On the other hand, the mica- and graphite-containing compositions exhibited both poor initial resistivity and failure after creasing.

While the composition of the invention has been exemplified in its primary application for the fabrication of membrane touch switches, it will be recognized by those skilled in the art that the compositions are also well adapted for use in other printed circuit applications using either flexible or rigid substrates.

I claim:

1. A screen printable conductor composition comprising
   a. 70–90% weight, basis total solids, of a conductive phase consisting essentially of finely divided particles of (1) 50–95% weight silver, and (2) 50–5% weight of a base metal selected from the group consisting of aluminum, tin and nickel and mixtures thereof dispersed in a solution of
   b. 30–10% weight, basis total solids, of polymers consisting essentially of (1) 10–65% weight of a multipolymer prepared by copolymerization of vinyl acetate, vinyl chloride and 0.3–10% weight ethylenically unsaturated dicarboxylic acid in which the weight ratio of vinyl chloride to vinyl acetate is from 3 to 8 and (2) 90–35% by weight of a linear aromatic polyester resin having an intrinsic viscosity of 0.5-1 dissolved in c. volatile nonhydrocarbon polar solvent in which the solvent has a boiling range of 150°-220° C.

2. The composition of claim 1 in which the base metal is aluminum.

3. The composition of claim 1 in which the base metal is tin.

4. The composition of claim 1 in which the dicarboxylic acid is maleic acid.

5. The composition of claim 1 in which the intrinsic viscosity of the polyester resin is 0.6-0.85.

6. The composition of claim 1 in which the polyester resin is the polycondensation product of a $C_{2-4}$ alkylene glycol with terephthalic or isophthalic acid.

7. The composition of claim 6 in which the polyester resin is poly(ethylene terephthalate).

8. The composition of claim 7 in which the solvent is carbitol acetate.

9. The composition of claim 7 in which the solvent ethylene glycol monoethylether acetate.

10. The composition of claim 9 in which the solvent is admixed with 1-methyl ethylene glycol butylether.

11. The composition of claim 1 comprising of 75-85% weight conductive phase and 25-15% weight polymers.

12. The composition of claim 1 in which the conductive phase consists essentially of 60-90% weight silver and 40-10% weight of base metal.

13. The composition of claim 1 in which the particles are no larger than 15 μm.

14. The composition of claim 13 in which the particles are 1-10 μm in size.

15. A method of making a membrane switching element comprising the sequential steps of
   (a) applying to a flexible organic polymeric substrate a pattern coating of the composition of claim 1 and
   (b) drying the coating to remove solvent therefrom.

16. A membrane switching element comprising a flexible organic polymer substrate having thereon a patterned coating of the composition of claim 1 which has been dried to remove solvent therefrom.

* * * * *